United States Patent [19]

Spandorfer

[11] 4,156,288
[45] May 22, 1979

[54] ASYNCHRONOUS SHIFT REGISTER WITH TURNPIKE FEATURE

[75] Inventor: Lester M. Spandorfer, Cheltenham, Pa.

[73] Assignee: Sperry Rand Corporation, New York, N.Y.

[21] Appl. No.: 915,326

[22] Filed: Jun. 13, 1978

[51] Int. Cl.² ................. G11C 21/00; G11C 13/00
[52] U.S. Cl. ........................... 365/78; 365/73; 328/37
[58] Field of Search ............ 365/78, 73, 74, 75, 365/76, 77; 328/37

[56] References Cited
U.S. PATENT DOCUMENTS 3,166,715  1/1965  Cogar ............................ 328/37
3,972,031  7/1976  Riemenschneider ............. 365/78

Primary Examiner—Terrell W. Fears
Attorney, Agent, or Firm—Thomas J. Scott; William E. Cleaver; Marshall M. Truex

[57] ABSTRACT

A data source is connected through a gating circuit to all stages of an asynchronous shift register. The gating circuit senses the full or empty status of each stage of the shift register and enters an incoming bit of data into that stage of the shift register which is the empty stage nearest the output, and has no stage preceding it which is full. The arrangement decreases the delay time normally encountered by data as it is shifted through the shift register, the decrease in delay time being related to the number of empty stages in the register at the time a bit of data is entered.

7 Claims, 8 Drawing Figures

ASYNCHRONOUS SHIFT REGISTER WITH TURNPIKE FEATURE

BACKGROUND OF THE INVENTION

This invention relates to asynchronous shift registers and more particularly to an improvement which permits data from a data source to be gated directly into that empty stage of the shift register that is nearest the output stage and has no full stage preceding it.

Asynchronous shift registers, also known as first-in first-out registers, are well known in the art and are frequently employed between a data source which supplies data to the shift register at one speed and a data sink which intermittently takes data from the shift register at another speed. A typical asynchronous shift register of the prior art is shown in U.S. Pat. No. 3,166,715 to Cogar. As exemplified by the patent to Cogar, it has been conventional in the prior art to supply all data from the data source to the first stage of the asynchronous shift register and to take data from the last or output stage of the shift register. Thus, each bit of data entered into the shift register must be successively shifted through all of the stages before it reaches the output stage. The shift registers may be quite long and frequently many of the stages nearest the input stage are empty at the time a bit of data is applied to the first stage. Obviously, this causes an undue delay in making the bit of data available at the output stage since it must be shifted through all of the empty stages.

BRIEF DESCRIPTION OF THE INVENTION

An object of the present invention is to provide an asynchronous shift register wherein each bit of data entered into the shift register need not shift through all of the stages of the shift register in order to reach the output stage.

An object of the present invention is to provide an asynchronous shift register in combination with means for entering a bit of data from a data source directly into any stage of the register.

An object of the invention is to provide an improvement in asynchronous data storage systems of the type including a source supplying data bits in sequence and an asynchronous shift register having a plurality of stages 1 . . . n connected in series with stage n being the output stage, each of the stages including a three state storage means for producing a first output signal indicating that the stage is empty or a second output signal indicating that the stage is storing a data bit, the improvement comprising an input control means connected to the data source and the three state storage means in each of the stages of directing a bit of data from the data source into the three state storage means in the stage nearest the output stage that is producing said first signal and has no stage preceding it wherein the three state storage means is producing said second output signal.

A further object of the invention is to provide an improved asynchronous data storage system of the type including a source supplying data bits in sequence and an asynchronous shift register having a plurality of stages 1 . . . n connected in series with an output from stage n, each of the stages including first means for storing a data bit and a second means for producing signals indicating the full/empty status of the first means of the same stage, the improvement comprising a plurality of input circuits, one input circuit being connected to each of said stages, and an input control means connected to the source and responsive to the second means in each of the stages for directing a data bit from the source only to the input circuit connected to the stage in the series nearest the output that is empty and has no stage preceding it which is full.

In accordance with the principles of the present invention an input control means is provided for connecting a data source to any stage of an asynchronous shift register. The input control means includes a gating means corresponding to each stage of the shift register. The gating means receives signals from the data source as well as signals from its corresponding stage, the stage preceding its corresponding stage and the stage following its corresponding stage. Data from the source is passed onto that stage which is empty, has a full stage following it, and an empty stage preceding it.

Other objects of the invention and its mode of operation will become apparent upon consideration of the following description and the accompanying drawings.

BRIEF DESCRIPTION OF THE DRAWINGS

FIG. 3 is a chart illustrating voltage levels at the outputs of three gates which comprise a three state storage means for a single stage of the shift register; and, FIGS. 4A-4E are diagrams illustrating the full and empty status of stages of an asynchronous shift register during operation thereof.

DETAILED DESCRIPTION OF THE INVENTION

Figure 1:
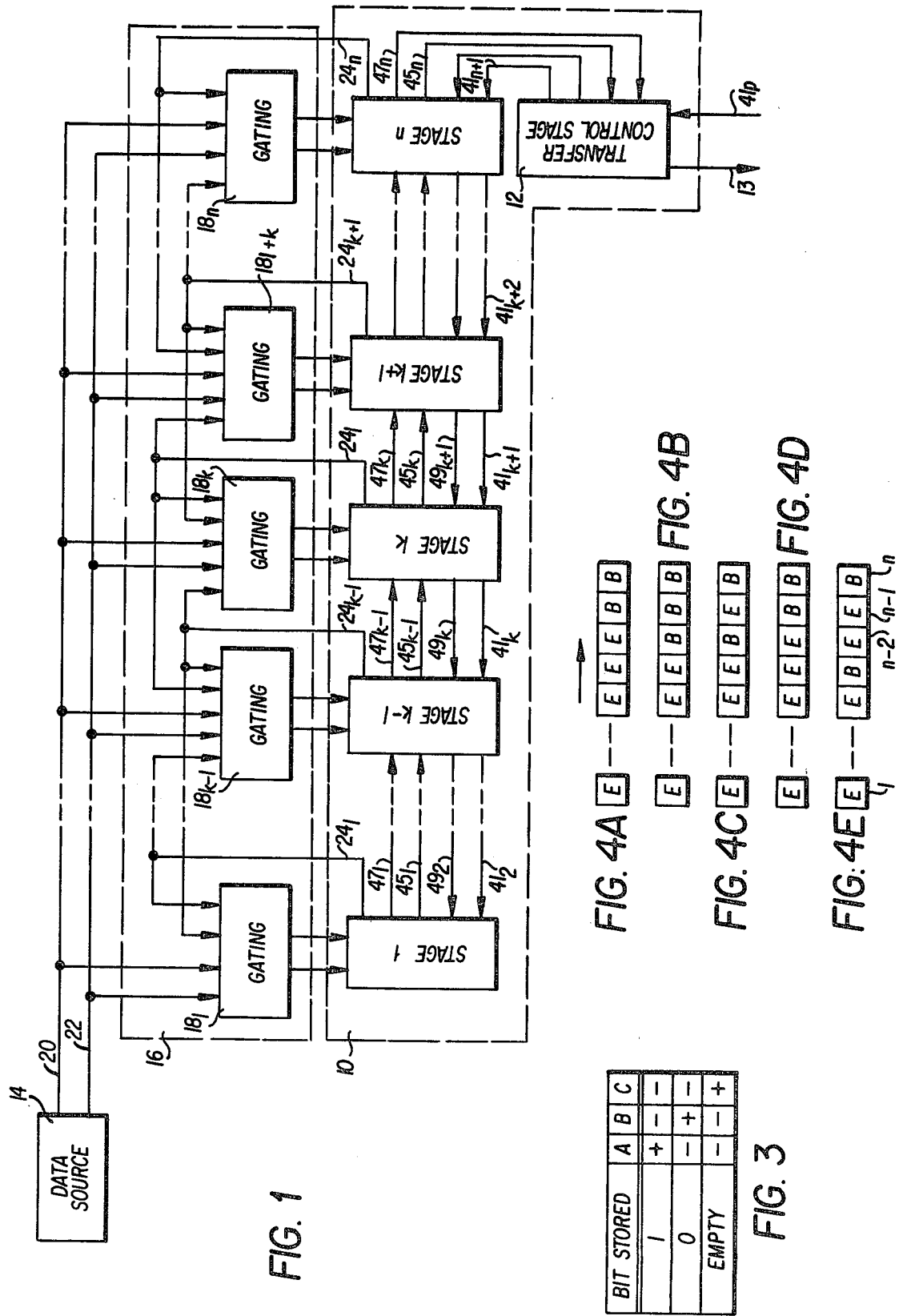
FIG. 1 is a block diagram of an asynchronous shift register having an input control means for gating data from a source into any stage of the shift register.

FIG. 1 shows a plurality of stages 1 through n connected in series to form an asynchronous shift register 10. As taught in the patent to Cogar, the shift register is provided with a transfer control stage 12 for controlling the transfer of data bits out of stage n of the register to a central processor or utilization device over a lead 13. The lead $41_p$ comes from the utilization device as explained in the Cogar patent and is utilized to initiate a readout from stage n of the register to the utilization device through the transfer control stage.

The Cogar patent teaches that a data source should be connected to stage 1 of the shift register so that each bit of data must pass through each stage of the register to reach the output 13. This results in an undue delay where the data is being entered into an empty shift register or into a shift register wherein only a few of the stages near the output stage n are full. In accordance with the principles of the present invention, all data is not entered into the register through stage 1 but is instead entered into the empty stage of the shift register nearest the transfer control stage.

Figure 2:
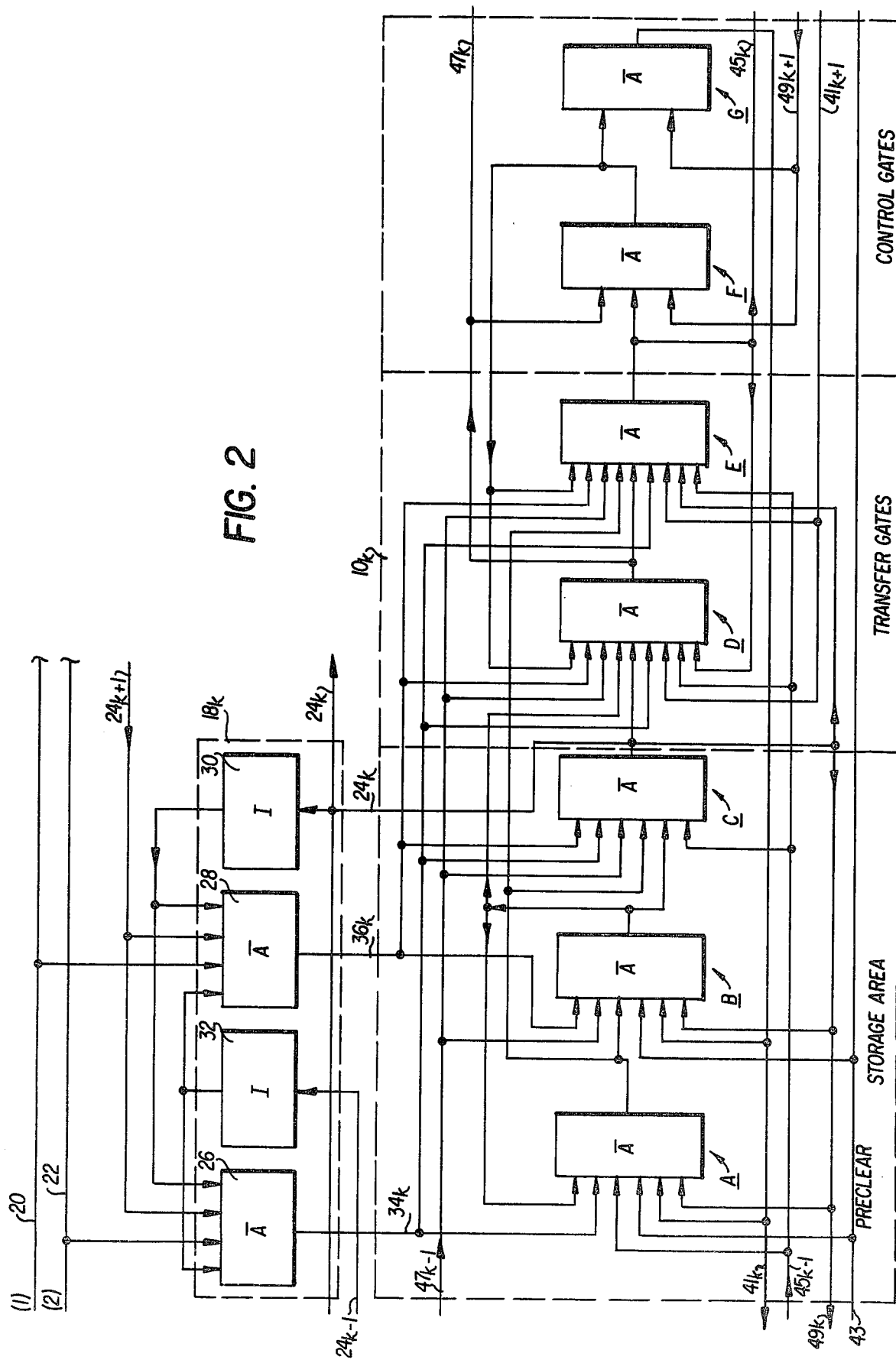
FIG. 2 shows the details of one stage of an asynchronous shift register and the gating means for gating data from a source into the stage.

Referring now to FIG. 2 which shows a typical stage $10_k$ of an asynchronous serial binary shift register of the type disclosed in Cogar U.S. Pat. No. 3,166,715, the stage comprises a storage area including gates A, B and C, two transfer gates D and E, and two control gates F and G. For purposes of describing the present invention all of the gates may be negative AND (NAND) gates which produce a positive or high level output signal only when all of the inputs are negative or at the low level. Obviously, other types of logic elements employing different voltage levels may be employed.

Gates A, B and C comprise a three state storage means having a first state when a binary one bit is stored therein, a second state when a binary zero bit is stored therein, and a third state when the storage means is empty or is storing no binary bit. FIG. 3 shows the output voltage levels for the gates A, B and C for the three states of the storage means. The output of gate C is positive only when the storage means is empty and is negative when the storage means is storing either a binary zero or a binary one. Gate A produces a positive output only when the storage means is storing a binary one bit, and gate B produces a positive output only when the storage means is storing a binary zero.

All stages of the shift register may be cleared by a positive preclear signal on lead 43. The preclear signal is applied to gates A and B of all stages of the shift register simultaneously. The positive preclear signal drives the outputs of gates A and B negative. The outputs of gates A and B are applied to gate C and since all other inputs to gate C will be negative, gate C produces a positive output signal that is fed back to gates A and B. When the preclear signal is terminated, the output of gate C causes the outputs of gates A and B to remain negative thereby holding the output of gate C positive. Thus, the storage means is latched in the empty state.

A binary one is entered into the storage means of stage k from the preceding stage k−1 by applying a positive pulse to the lead $47_{k-1}$. Lead $47_{k-1}$ is connected from the output of gate D of the preceding stage to the inputs of gates B and C. The positive pulse on lead $47_{k-1}$ drives the outputs of gates B and C negative. If other inputs to gate A are negative, the negative outputs of gates B and C cause gate A to produce a positive output. The positive output of gate A is applied to gates B and C to hold their outputs negative even after the pulse on lead $47_{k-1}$ is terminated. From FIG. 3, it is seen that a positive output from gate A in combination with negative outputs from gates B and C indicate that a binary one bit is stored in the storage means.

A binary zero is entered into the storage means of stage k by placing a positive pulse on the lead $45_{k-1}$. This lead is connected to the output of gate E of stage K−1. When lead $45_{k-1}$ goes positive, indicating a binary zero, it drives the outputs of gates A and C negative. With all other inputs to gate B being negative, the negative outputs from gates A and C cause the output of gate B to go positive. The output of gate B holds the outputs of gates A and C negative even after the positive pulse on lead $45_{k-1}$ is terminated. From FIG. 3, it is seen that a positive output from gate B in combination with negative outputs from gates A and C indicates that the storage means is storing a binary zero.

Transfer gate D shown in FIG. 2 controls the transfer of a binary one bit, stored in the storage means of stage k, over the lead $47_k$ to the storage means of the succeeding stage k+1. In like manner, transfer gate E controls the transfer of a zero bit from the storage means of stage k over the lead $45_k$ to the storage means of succeeding stage k+1. Both gates D and E have inputs connected to the leads $47_{k-1}$ and $45_{k-1}$. The positive pulses on these leads block gates D and E so that an output cannot be transferred from the stage k storage means while a binary bit is being transferred to the storage means. Thus, a binary bit appearing on either of the leads $45_{k-1}$ or $47_{k-1}$ must be entered into the storage means and the positive pulse on the lead terminated before the bit may be transferred from the storage means of stage k to the next succeeding stage. The output of gate C is also connected as an input to gates D and E and this output is negative only if the storage means is storing a binary bit.

Gates D and E of stage k are enabled to transfer a binary bit to stage k+1 only if stage k+1 is empty. If stage k+1 is empty the output of gate C of that stage is positive and this signal is fed back over the lead $49_{k+1}$ to control gate F. The positive input signal to gate F drives its output negative and this signal is fed back to control gates D and E thereby partially enabling both gates. The signal on lead $41_{k+1}$ will be negative at this time since it is positive only during the period the succeeding stage k+1 is being reset. Thus, when the output of gate F goes negative, one of the gates D or E is fully enabled depending upon whether the storage means is storing a binary one or a binary zero. The resulting positive output from the gate D or E holds the output of gate F negative. The positive output from gate D or E is applied over lead $47_k$ or lead $45_k$ to the storage means of stage k+1 to enter the binary bit therein. When the binary bit is entered into the storage means of stage k+1 the lead $49_{k+1}$ goes negative. With the output of gate F negative and the lead $49_{k+1}$ also negative, gate G produces a positive output signal on the lead $41_k$. This signal is applied to gates A and B to reset the storage means of stage k in the same manner as the preclear signal previously described. The signal on lead $41_k$ is also applied to the transfer gates D and E of the preceding stage k−1. As shown in FIG. 2, when the lead $41_{k+1}$ goes positive, it drives the outputs of gates D and E negative thus enabling two inputs of gate F. With succeeding stage k+1 empty, the lead $49_{k+1}$ is negative so gate F produces a positive output signal. This signal drives the output of gate G negative and, disables gates D and E so that their outputs remain negative even after the lead $41_{k+1}$ returns to the negative level.

Stage $10_k$ of FIG. 2 is like a typical stage as illustrated in the aforementioned Cogar patent, modified only to provide input circuits $34_k$ and $36_k$ and an output $24_k$ for the purpose subsequently described. A plurality of stages like stage $10_k$ may be connected in series to form an asynchronous shift register 10 as illustrated in FIG. 1.

In FIG. 1, a data source 14 is connected through an input control means 16 to each stage of the shift register 10. The input control means comprises a plurality of gating means $18_1$ through $18_n$, there being one gating means corresponding to each stage of the shift register. Data source 14 has two output leads 20 and 22 which are connected to each of the gating means $18_1$ through $18_n$. Lead 20 is driven negative by data source 14 to represent a binary one bit while lead 22 is driven negative to represent a binary zero bit. If data source 14 is producing no output data, then both leads 20 and 22 are positive.

Considering gating means $18_k$ as typical, the gating means receives inputs over the leads 20 and 22 from the data source 14 as well as inputs from shift register stages k−1, k and k+1 over the leads $24_{k-1}$, $24_k$ and $24_{k+1}$.

Referring for the moment to FIGS. 4A–4D, FIG. 4A illustrates an asynchronous shift register storing only two bits of information while FIG. 4B shows the same shift register storing only three bits. FIG. 4C shows the same shift register after the right-most bit of FIG. 4B has been removed from the last stage n of the shift register, the second bit has been shifted into the last stage n, but before the thired bit has been shifted into stage n−1. FIG. 4D shows the same data bits as FIG. 4C but at an instant later, after the bit in stage n−2 has been shifted into stage n−1. Inspection of FIGS. 4A–4D shows that if one were to enter another bit of data into the register at any of the instances illustrated by FIGS. 4A–4D, the data should go into a stage which is empty, has a full stage succeeding it and an empty stage preceding it. These observations may be implemented in a gating means $18_k$ as illustrated in FIG. 2.

The gating means $18_k$ includes two negative AND gates 26 and 28 and two inverters 30 and 32. Gate 26 is for controlling the passage of signals representing binary zones from lead 22 to stage k of shift register 10 while gate 28 is for controlling the passage of signals representing binary ones from lead 20 to stage k of the shift register. The output of gate C of stage k is connected to inverter 30 and the output of the inverter is connected as an input to gates 26 and 28. In like manner, the output of gate C of stage k−1 is connected to the inverter 32 and the output of inverter 32 is connected as an input to the gates 26 and 28. The output of gate C of stage k+1 is connected by the lead $24_{k+1}$ to inputs of gate 26 and 28. It should be understood that the output of gate C of stage k is connected by leads $24_k$ directly to gates 26 and 28 of the preceding stage k−1 and to the inverter 32 (not shown) of the succeeding stage k+1.

Considering now stage $10_k$ of FIG. 2, if the storage means is storing a binary bit (either zero or one) the output of gate C is negative and the resulting output of inverter 30 blocks gates 26 and 28 so that binary data on either of the leads 20 or 22 cannot pass through the gates 26 and 28. On the other hand, if stage k is empty then the positive output of gate C is inverted by inverter 30 and enables one input of the gates 26 and 28. If at this time stage k+1 is full, the lead $24_{k+1}$ is negative to further enable gates 26 and 28. If stage k−1 is empty, then the positive signal on lead $24_{k-1}$ is inverted by inverter 32 to further enable gates 26 and 28. A binary zero may now be gated through gate 26 or a binary one may be gated through gate 28.

Assume first that the data source 14 drives lead 22 negative to represent a binary zero. With all inputs to gate 26 being negative, gate 26 produces a positive signal on lead $34_k$. This lead is connected as an input circuit to gates A, C, D and E of stage k in the same manner as the zero input lead $45_{k-1}$ from the preceding stage. Thus, the storage area of stage k responds to a positive signal on lead $34_k$ to store a binary zero indication.

If the data source produces a negative pulse on lead 20 indicating a binary one, gate 28 produces a positive output signal on lead $36_k$ if all other inputs to the gate 28 are negative. The lead $36_k$ is connected as an input to gates B, C, D and E of stage k in the same manner as the binary one input lead $47_{k-1}$ from the preceding stage. Thus, the storage means responds to a positive pulse on lead $36_k$ to store a binary one indication.

In summary, any given stage k of the shift register may have a data bit (either a zero or a one) entered therein from the preceding stage over the leads $45_{k-1}$ and $47_{k-1}$, or directly from the data source through gating means $18_k$ over the leads $34_k$ and $36_k$. The gating means $18_k$ is enabled to pass data from the data source to the shift register stage only if the stage is the empty stage nearest the output of the shift register and has no stage preceding it which is full. These conditions are determined by the gating means $18_k$ by sensing the full/empty status of the storage means for stages k−1, k and k+1.

For ease of description, it has been assumed in the foregoing description that the gates in the various stages of the shift register are matched or have substantially equally operating times so that no more than one empty stage will appear between two full stages, as illustrated in FIG. 4C. Should this not be the case, it is possible for more than one empty stage to appear between two full stages as data is asynchronously shifted through the register. For example, FIG. 4E illustrates the condition where initially there were bits in stages n−2 and n−3 but the bit in stage n−2 has shifted to stage n−1 and then to stage n before the bit in stage n−3 has shifted to stage n−2. An incoming bit occurring at this instant would be gated into stage n−1. In order to overcome this problem, it may be desirable to provide the gates 26 and 28 in the gating means 18 with an additional input derived from gate C of the shift register stage two positions near the output of the shift register. That is, for stage k the gates 26 and 28 may be provided with an additional input from gate C of stage k−2. Under these conditions a data bit would be gated through gating means $18_k$ only if stage k+1 were full and stages k, k−1, and k−2 were empty. This concept may be further extended depending upon the degree of mismatch of the shift register gates.

In FIG. 1, it should be noted that the gating means $18_1$ and $18_n$ differ somewhat from the gating means $18_2$ through $18_{n-1}$. Gating means $18_1$ receives no control input from gate C of a preceding stage while gating means $18_n$ receives no control input from a succeeding stage. This creates no problem if the gates in the shift register stages 1...n are matched as described above so that no more than one empty stage exists between two full stages. However, should the gates of the shift register stages not have substantially equal operating times it may be desirable to provide the gating means $18_n$ with an additional inverter 32 (see FIG. 2) the input of this additional inverter being connected to the gate C of stage n−2.

While a preferred embodiment of the invention has been described in specific detail for purposes of illustration, it will be understood that various modifications, additions and substitutions may be made therein without departing from the spirit and scope of the invention as defined by the appended claims. For example, several binary asynchronous shift registers 10 may be provided in parallel as taught in the aforementioned Cogar patent to handle parallel coded information. In this case, an input control means 16 is provided for each of the shift registers 10. In some cases, it may be desirable to block the data source 14 so that it produces no output data when the shift register 10 is full. As taught in the Cogar patent, feed-back signals derived from stage 1 of the shift register may be utilized to control the data source 14. Other modifications will be apparent to those skilled in the art and others. It is intended therefore to be limited only by the scope of the appended claims.

I claim:

1. In an asynchronous data storage system including a source supplying data bits in sequence and an asynchronous shift register having a plurality of stages 1...n connected in series with an output from stage n, each of said stages including first means for storing a data bit and a second means for producing signals indicating the full/empty status of the first means of the same stage, the improvement comprising: a plurality of input circuits, one input circuit being connected to each of said stages; and an input control means connected to said source and responsive to said second means in each of said stages for directing a data bit from said source only to the input circuit connected to the stage in said series nearest said output that is empty and has no stage preceding it which is full.

2. The improvement as claimed in claim 1 wherein said input control means comprises a plurality of gating means, there being one gating means for each of said stages, the gating means for a particular stage k in said series being connected to said source and responsive to the output signals from the second means in stage k and the second means in at least one of the stages adjacent to stage k in said series.

3. The improvement as claimed in claim 2 wherein the gating means for said particular stage k is connected to and responsive to the second means in stages $k-1$, k and $k+1$ for directing a data bit from said source to the input circuit of stage k when said second means of stages $k-1$, k and $k+1$ produce signals indicating that stages $k-1$ and k are empty and stage $k+1$ is full.

4. The improvement as claimed in claim 2 wherein the input circuit for said particular stage k is connected to the first and the second means of stage k whereby a data bit directed by the gating means for stage k is stored in said stage k first means and terminates the signal indicating the empty status of stage k.

5. In an asynchronous data storage system including a first bus for conveying zero bits and a second bus conveying one bits, and an asynchronous shift register having a plurality of stages 1 ... n connected in series, each said stage including a zero gate, a one gate, and a full-/empty status gate, the improvement comprising a gating means for each of said stages, the gating means for a particular stage k of said series comprising: a first gate having an input connected to said first bus and an output connected to the zero gate of stage k and said status gates of stage k; a second gate having an input connected to said second bus and an output connected to said one gate of stage k and said status gate of stage k; and further means connecting the outputs of the status gates of stage k and at least of the stages adjacent to stage k to the inputs of the first and second gates of stage k.

6. The improvement as claimed in claim 5 wherein said further means comprises means connecting the outputs of the status gates of stages $k-1$, k and $k+1$ to the inputs of said first and second gates of stage k whereby said first or said second gate is enabled to pass a zero or a one bit, respectively when stage $k+1$ is full and stage k and $k-1$ are empty.

7. In an asynchronous data storage system including a source supplying data bits in sequence and an asynchronous shift register having a plurality of stages 1 ... n connected in series with stage n being the output stage, each of said stages including a three state storage circuit means for producing a first output signal indicating that the stage is empty or a second output signal indicating that the stage is storing a data bit, the improvement comprising: input control means connected to said source and said three state storage circuit means in each of said stages for directing a bit of data from said source into the three stage storage circuit means in the stage nearest said output stage that is producing said first signal and has no stage preceding it wherein the three state storage circuit means is producing said second output signal.

* * * * *